United States Patent
Chen et al.

(10) Patent No.: US 12,501,587 B2
(45) Date of Patent: Dec. 16, 2025

(54) ARRAYED COLD PLATE FOR DIMMS

(71) Applicant: Quanta Computer Inc., Taoyuan (TW)

(72) Inventors: Chao-Jung Chen, Taoyuan (TW); Kun-Pei Liu, Taoyuan (TW); Yu-Nien Huang, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 281 days.

(21) Appl. No.: 18/180,687

(22) Filed: Mar. 8, 2023

(65) Prior Publication Data
US 2024/0237296 A1    Jul. 11, 2024

Related U.S. Application Data

(60) Provisional application No. 63/478,831, filed on Jan. 6, 2023.

(51) Int. Cl.
*H05K 7/20* (2006.01)
*F28F 3/02* (2006.01)

(52) U.S. Cl.
CPC .......... *H05K 7/20636* (2013.01); *F28F 3/02* (2013.01); *H05K 7/20254* (2013.01); *H05K 7/20263* (2013.01); *H05K 7/20272* (2013.01); *F28F 2260/02* (2013.01)

(58) Field of Classification Search
CPC .......... H05K 7/20636; H05K 7/20254; H05K 7/20272; F28F 3/02
See application file for complete search history.

(56) References Cited

U.S. PATENT DOCUMENTS

| | | | | |
|---|---|---|---|---|
| 8,570,744 | B2 * | 10/2013 | Rau | H01L 23/473 361/720 |
| 2022/0377938 | A1 * | 11/2022 | Chen | H05K 7/20272 |
| 2023/0047496 | A1 * | 2/2023 | Franz | H05K 7/20272 |

OTHER PUBLICATIONS

ATP Inc. Introduction to NVMe Solid State Drive Form Factors Apr. 16, 2021 web address: https://www.atpinc.com/blog/solid-state-drive-form-factors-for-NVMe (Year: 2021).*

* cited by examiner

*Primary Examiner* — Jayprakash N Gandhi
(74) *Attorney, Agent, or Firm* — Nixon Peabody LLP

(57) ABSTRACT

A cooling assembly for liquid cooling of a heat-generating component such as a dual in-line memory module (DIMM) in a computer device is disclosed. The cooling assembly includes a bracket holding a micro-pipe assembly. The micro-pipe assembly has a cold manifold, a hot manifold and a series of micro-pipes. The micro-pipes are fluidly coupled between the cold manifold and hot manifold to allow coolant flow between the cold manifold and the hot manifold. The bracket positions the micro-pipe assembly such that micro-pipes are positioned proximate to opposite sides of the heat-generating component. A coolant inlet supplies coolant to the cold manifold and a coolant outlet collecting coolant from the hot manifold.

20 Claims, 16 Drawing Sheets

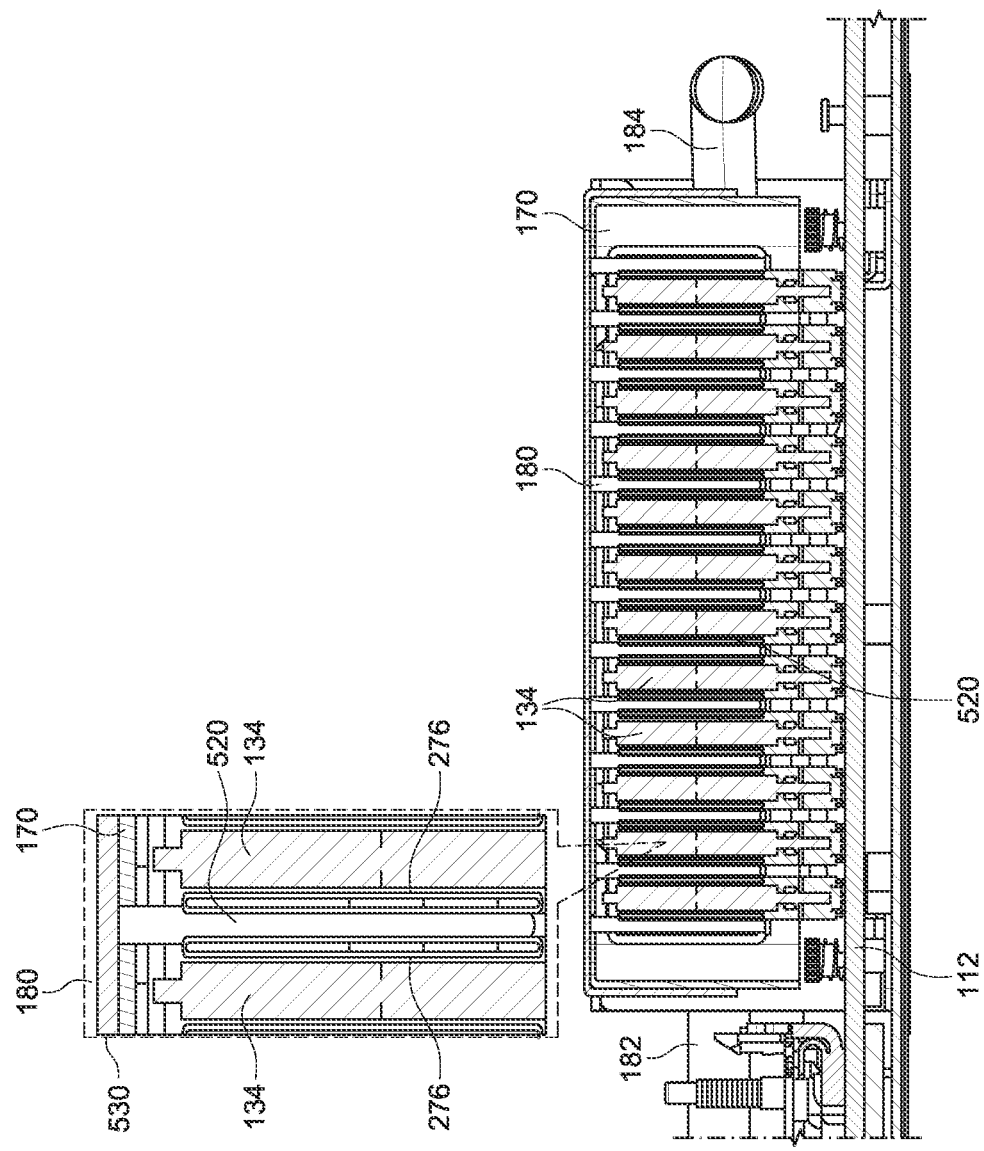

ARRAYED COLD PLATE FOR DIMMS

CROSS-REFERENCE TO RELATED APPLICATIONS

This application claims priority from and benefit of U.S. Provisional Patent Application Ser. No. 63/478,831, filed on Jan. 6, 2023, which is hereby incorporated by reference herein in its entirety.

TECHNICAL FIELD

The present invention relates generally to liquid cooling systems, and more specifically, to a cold plate assembly allowing liquid cooling for an array of heat generating components.

BACKGROUND

Electronic components, such as servers, include numerous electronic components that are powered by a common power supply. Servers generate an enormous amount of heat due to the operation of internal electronic devices such as controllers, processors, and memory module. Overheating from the inefficient removal of such heat has the potential to shut down or impede the operation of such devices. Thus, servers were designed to rely on air flow through the interior of the server to carry away heat generated from electronic components. Servers often included various heat sinks attached to the electronic components such as processing units. Heat sinks absorb the heat from the electronic components, thus transferring the heat away from the components. The heat from heat sinks must be vented away from the server. Air flow to vent away such heat was often generated by a fan system that included a series of fans.

With the advent of more powerful components, traditional air cooling in combination with fan systems is inadequate to sufficiently remove heat generated by newer generation components. For example, since next generation processors, such as CPUs or graphic processing units (CPUs), enhance processing speed with high power consumption, a traditional heatsink combined with air cooling cannot satisfy thermal conduction requirements. This is also increasing the case for other heat generating devices such as dual in line memory modules (DIMM), and solid state devices such as those that conform to either the U.2 or M.2 standard that are typically in proximity to the processor.

Thus, liquid cooling mechanisms have been developed for processors and other components that require better cooling in new server designs. Liquid cooling is the currently accepted solution for rapid heat removal in such designs due to the superior thermal performance. At room temperature, the heat transfer coefficient of air is only 0.024 W/mK, while a coolant, such as water, has a heat transfer coefficient of 0.58 W/mK, which is 24 times than that of air. Thus, liquid cooling is more effective in transporting heat away from a heat source such as a server to an external radiator, which may transfer heat from the coolant. Use of liquid cooling allows efficient heat removal from critical parts.

In rack level liquid cooling system designs, a closed loop cooling system and an open loop cooling system are employed to facilitate heat exchange. Known closed loop liquid cooling systems use heat exchange to cool hot water which is heated from a heat source such as a server. Heat is then removed from the hot water in the closed loop liquid cooling system via an open loop system such as a radiator in proximity to a fan wall. Both of these components are typically installed in the rack. The closed loop cooling system includes the heat source (e.g., server) and a heat exchanger. A liquid flow pipe carries coolant liquid to the heat source. Heat generated by the heat source is transferred to the coolant liquid. A liquid flow pipe carries heated liquid away from the heat source.

The rack holds a series of servers. Within each of the servers, an inlet tube carries coolant liquid to one or more cold plates that are each attached over a heat-generating electrical component, such as a processor chip. The cold plate has a network of internal conduits or channels that circulate the coolant internally in the cold plate. Each processor in a server may have a dedicated cold plate or share a cold plate with another processor. Heat generated by the processor is transferred to the cold plate and is in turn transferred to the coolant liquid circulating through the cold plate. An outlet tube carries heated liquid away from the cold plate.

However, while cold plates are effective for cooling the processor chip itself, other heat-generating components in proximity to the processor, such as DIMMs, also may require enhanced cooling. Such DIMMs are often arranged in an array and thus make it challenging to employ an effective liquid cooling mechanism as known cold plates are not designed for an array of DIMMs. One solution is multiple pipes that are connected for liquid flow in a structure adapted to the cooling requirements of such devices. However, such designs are cumbersome and do not allow easy access to the DIMMs should the DIMM need to be replaced.

Thus, there is a need for a liquid cooling mechanism that is tailored to an array heat generating devices. There is also a need for an array type liquid cooling device that allows easy service of an array of heat generating devices. There is also a need for a mechanism that allows ready assembly of a liquid cooling system for an array of heat generating devices.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, an example cooling assembly for cooling a heat-generating component is disclosed. The cooling assembly includes a micro-pipe assembly having a cold manifold, a hot manifold and first and second micro-pipes. The first and second micro-pipes are fluidly coupled between the cold manifold and hot manifold to allow coolant flow between the cold manifold and the hot manifold. A bracket positions the micro-pipe assembly relative to the heat-generating component such that the first and second micro-pipes are in proximity to respective sides of the heat-generating component. A coolant inlet supplies coolant to the cold manifold. A coolant outlet collects coolant from the hot manifold.

A further implementation of the example cooling assembly includes a base member mounted on a bottom panel of a chassis. The heat-generating component is mounted on a circuit board mounted on the bottom panel. The bracket is attached to the base member and extends over the circuit board. Another implementation is where the heat-generating component is a dual-in line memory module (DIMM). Another implementation is where the heat-generating component is a device conforming to at least one of E.1S, U.2, or M.2 standards. Another implementation is where the bracket is rotatably attached to the base member. When the bracket is rotated in a closed position, the first and second micro-pipes are positioned in proximity of the heat-generating component. When the bracket is rotated to an open position the heat generating component is accessible. Another implementation is where the DIMM is one of multiple DIMMs inserted in parallel sockets in proximity to a processor on the circuit board. Another implementation is where the first and second micro-pipes are included in multiple micro-pipes that each are fluidly coupled between the cold manifold and hot manifold to allow coolant flow between the cold manifold and the hot manifold. Another implementation is where the cooling assembly includes a cover coupled to the bracket. The cover includes a vertical fin inserted parallel to the heat-generating component to force the first micropipe into contacting the heat-generating component. Another implementation is where the cover is rotatably attached to the bracket. Another implementation is where the cover slides in position over the bracket via registration features.

According to certain aspects of the present disclosure, an example computer device is disclosed. The computer device includes a circuit board and a heat-generating computer component mounted on the circuit board. A micro-pipe assembly has a cold manifold, a hot manifold and first and second micro-pipes. The first and second micro-pipes are fluidly coupled between the cold manifold and hot manifold to allow coolant flow between the cold manifold and the hot manifold. A bracket positions the micro-pipe assembly relative to the heat-generating component such that the first and second micro-pipes are in proximity to respective sides of the heat-generating component. A coolant inlet supplies coolant to the cold manifold. Aa coolant outlet collects coolant from the hot manifold.

A further implementation of the example computer device includes a base member mounted on a bottom panel of a chassis. The heat-generating component is mounted on a circuit board mounted on the bottom panel. The bracket is attached to the base member and extends over the circuit board. Another implementation is where the heat-generating component is a dual-in line memory module (DIMM). Another implementation is where the heat-generating component is a device conforming to at least one of E.1S, U.2, or M.2 standards. Another implementation is where the bracket is rotatably attached to the base member. When the bracket is rotated in a closed position, the first and second micro-pipes are positioned in proximity of the heat-generating component. When the bracket is rotated to an open position the heat generating component is accessible. Another implementation is where the DIMM is one of multiple DIMMs inserted in parallel sockets in proximity to a processor on the circuit board. Another implementation is where the first and second micro-pipes are included in multiple micro-pipes that each are fluidly coupled between the cold manifold and hot manifold to allow coolant flow between the cold manifold and the hot manifold. Another implementation is where the computer device includes a cover coupled to the bracket. The cover includes a vertical fin inserted parallel to the heat-generating component to force the first micropipe into contacting the heat-generating component. Another implementation is where the cover is rotatably attached to the bracket. Another implementation is where the cover slides in position over the bracket via registration features.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 5B is a cross section view of the example cooling assembly with the first type of cover, according to certain aspects of the present disclosure;

DETAILED DESCRIPTION

Figure 1A:
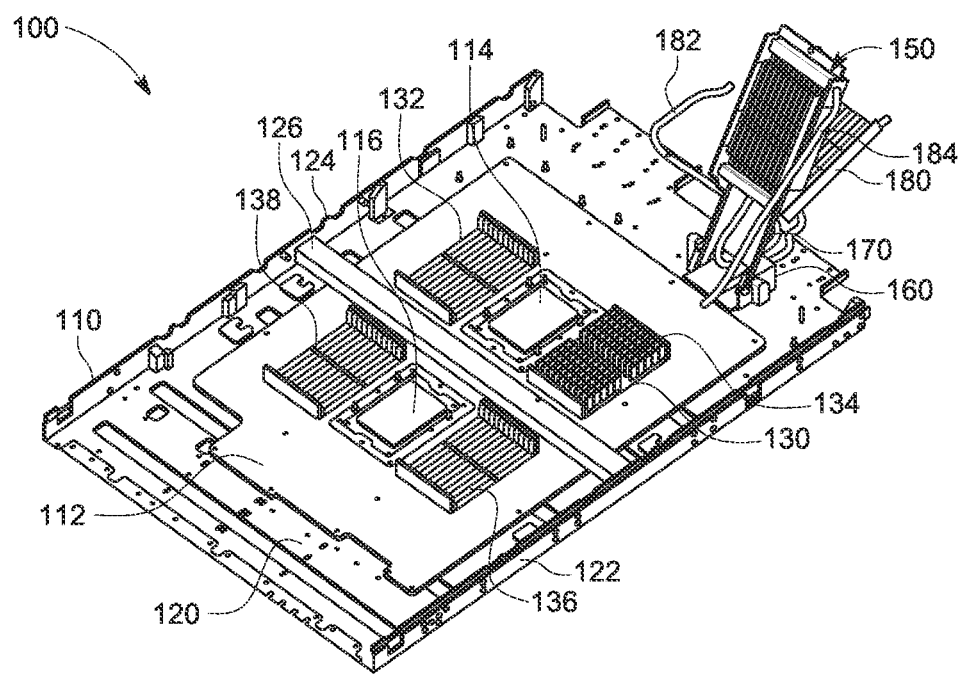
FIG. 1A is a perspective view of a computer system with an example liquid cooling system for cooling an array of heat-generating devices, according to certain aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure relates to a liquid cooling assembly that includes a cold plate bracket with a micro-pipe assembly for implementation of liquid cooling of an array of heat generating support components, such as dual in-line memory modules (DIMM). The example assembly includes a support that is installed in proximity to the DIMMs. The cold plate bracket is configured to be rotated to a closed position thus positioning the micro-pipes in proximity to the DIMMs. The cold plate bracket can be rotated to an open position that allows to allow access to replace/maintain the heat generating devices without movement of the micro-pipes. One aspect is a rotating design of a cover between the cold plate bracket and the micro-pipe assembly. The cover has parallel fins that are inserted between the micro-pipes to facilitate contact between the micro-pipes and the DIMMs for maximizing liquid cooling performance. Another aspect is a slider design for the cover that allows the cover to be guided downward to engage the cold plate bracket to engage the parallel fins.

FIG. 1A is a cutaway perspective view of a computer device 100, such as an application server. In this example, the server may be installed in a rack with other servers, switches, and a liquid cooling system that provides liquid coolant to the servers in the rack. The principles herein may be adopted for other computer components such as a storage server, an application server, a storage device, a network switch, or other computing devices. The computer device 100 includes a chassis 110, circuit boards such as a motherboard 112, two processors 114 and 116. In this example each of the two processors 114 and 116 are inserted in sockets. The sockets allow the attachment of a cooling device such as a heat sink or a cold plate that is bolted over the respective processors 114 and 116 to allow either air cooling or liquid cooling of the processors 114 and 116. The chassis 110 includes a bottom panel 120 that is mounted on the motherboard 112. The chassis 110 includes side walls 122 and 124. A lateral cross member 126 extends across the side walls 122 and 124 between the processors 114 and 116. The cross member 126 may be inserted on the side walls 122 and 124 for easy removal, or be attached with screws or the like to the side walls 122 and 124. In this example, the chassis 110 is a one U server unit and thus has a 1 U height, but the principles of this disclosure may be applied for computer devices of differing heights and dimensions. The chassis 110 also holds support components such as power supplies, circuit boards, device cards, processors, memory devices, and other elements.

Each of the sockets of the processors 114 and 116 are mounted on the motherboard 112 next to double data rate (DDR) dual in line memory modules (DIMM)s, that function as random access memory (RAM) for use by the respective processor. Thus, there are two arrays of parallel DIMM sockets 130 and 132 on the sides of the processor 114. Each of the array of sockets 130 and 132 include sockets for twelve DIMMs 134 in this example. Correspondingly, there are two arrays of DIMM sockets 136 and 138 on the sides of the processor 116 that include similar sockets for twelve DIMMs.

In this example, cold plates (not shown) may be attached to a chip socket that holds the processor 114 so the cold plate is in thermal contact with the chip of the processor 114. The cold plate receives coolant from a supply connector and heat is carried away via the coolant to a collection connector. Similarly, the liquid cooling system also circulates coolant to carry away heat generated from the processor 114.

In this example, the computer device 100 is generally placed in the rack. The rack mounted liquid cooling system has a cold coolant manifold and a hot coolant manifold. In this example, the rear of the chassis 110 includes a main coolant inlet connector that may be connected to a fluid coupler of the cold coolant manifold that distributes coolant to different cold plates in the chassis 110. The rear of the chassis 110 also includes a main outlet connector that may be connected to a fluid coupler of the hot coolant manifold that collects heated coolant. The chassis 110 may thus include an internal network of fluid tubes that circulate coolant received from the main coolant connector to sets of liquid cooling devices such as cold plates. The network of fluid tubes also collects heated coolant from the liquid cooling devices and returns the heated coolant to the main outlet connector.

The liquid cooling system generally includes a heat exchanger that receives the hot coolant from hot coolant manifold. The heat exchanger generally includes a radiator that circulates the hot coolant. A fan wall provides cooling of the coolant in the radiator and thus heat from the heated coolant is transferred to the radiator to the ambient air. The now cooled coolant is circulated from the radiator by a pump of a coolant distribution unit to the cold coolant manifold and recirculated.

Although the processors 114 and 116 generate large amounts of heat, other heat-generating components such as the DIMMs 134 may also benefit from liquid cooling. Thus, each of the DIMMs 134 on each of the arrays of sockets 130, 132, 136 and 138 may be liquid cooled by an example cooling assembly 150 that may be rotated from an open position shown in FIG. 1A to a closed position shown in FIG. 1B. For explanation only one cooling assembly 150 is shown on the DIMMs 134 for the array of sockets 130. The cooling assembly 150 provides liquid cooling through parallel micro-pipes positioned on respective sides of heat generating components such as the DIMMs 134 as will be explained below.

Figure 1B:
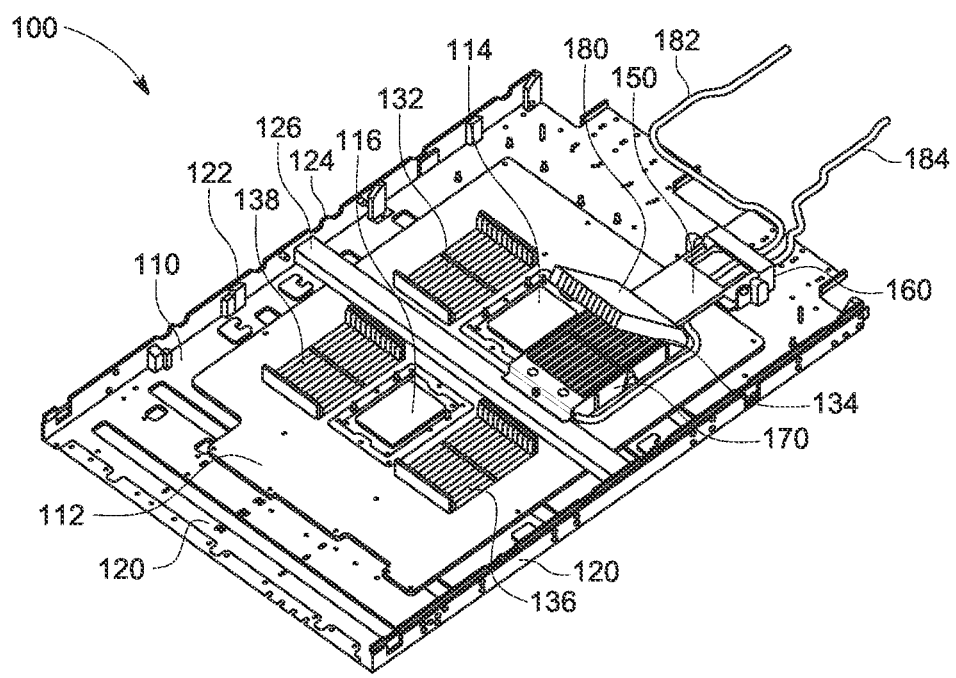
FIG. 1B is a perspective view of the computer device in FIG. 1A with the example liquid cooling system in a deployed position, according to certain aspects of the present disclosure.

The cooling assembly 150 in FIGS. 1A-1B includes a support base 160, a cold plate bracket 170, and a cover 180. Coolant is supplied to a coolant inlet of the cold plate bracket 170 via an inlet hose 182. The coolant flows through a set of micro-pipes supported by the cold plate bracket 170 to absorb heat from the DIMMs 134 in the array of sockets 130. The heated coolant is collected and returned through a hot coolant hose 184 attached to a coolant outlet of the cold plate bracket 170. The cooling assembly 150 allows the cold plate bracket 170 to be rotated to the closed position in FIG. 1B, where the micropipes are inserted between the individual DIMMs 134. The micro-pipes are forced into thermal contact with the DIMMs by downward extending fins that are attached to the cover 180. Thus, the hoses 182 and 184 are corrugated stainless steel flexible hoses in this example that allow the cold plate bracket 170 to be freely rotated between the closed position and open position. The open position allows ready access to the DIMMs 134, allowing a DIMM to be removed from a socket or a DIMM to be inserted in the sockets in the array of sockets 130.

Figure 2A:
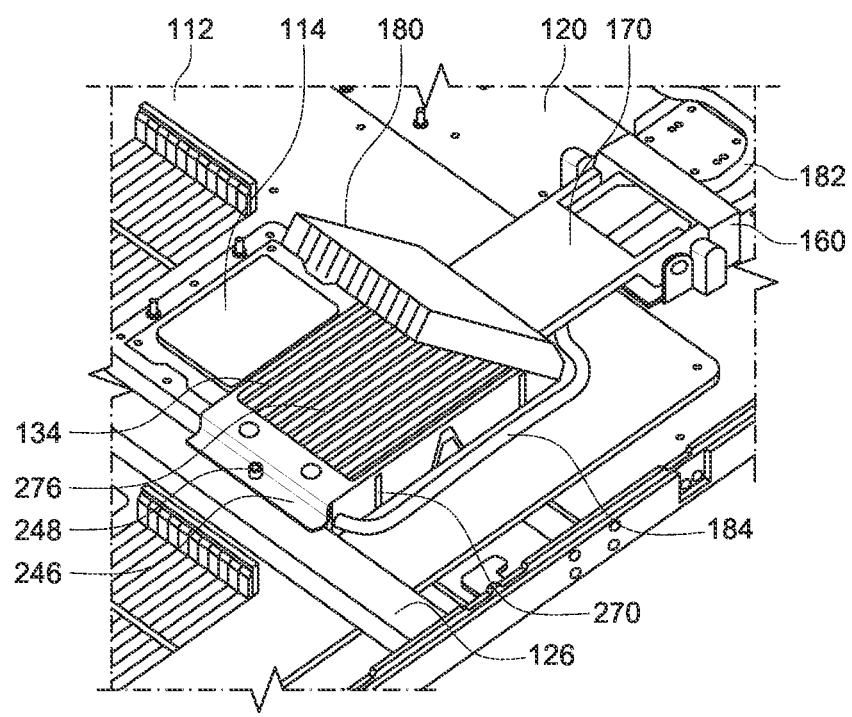
FIG. 2A is a close-up perspective view of the cold plate bracket of the example cooling assembly in FIG. 1A in a deployed position, according to certain aspects of the present disclosure.
Figure 2B:
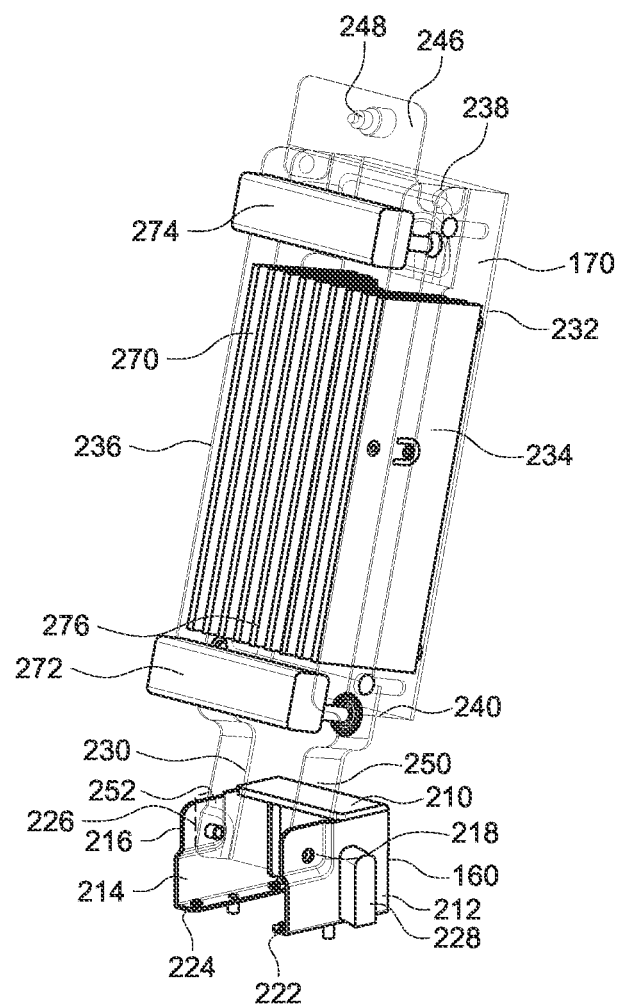
FIG. 2B is a close-up isolated perspective view of the example cooling assembly, according to certain aspects of the present disclosure.

FIG. 2A is a close-up perspective view of the cooling assembly 150 in a deployed position over the DIMMs 134 in the array of sockets 130. FIG. 2B is a perspective view of the support base 160 and the cold plate bracket 170. Like elements in FIGS. 2A-2B are labeled with identical reference numbers as their counterparts in FIGS. 1A-1B. The support base 160 includes a cross bar 210 that is attached to two downward extending parallel supports 212 and 214. The supports 212 and 214 have respective tabs 216 and 218 that allow a pin to be inserted to rotatably attach the cold plate bracket 170. The ends of the supports 212 and 214 opposite the cross bar 210 include perpendicular flanges 222 and 224. Each of the flanges 222 and 224 may include holes therethrough that allow the support base 160 to be attached via screws or bolts to the bottom panel 120 of the chassis 110 on a side of the motherboard 112. Lateral supports 226 and 228 are attached to the supports 212 and 214.

Figure 2C:
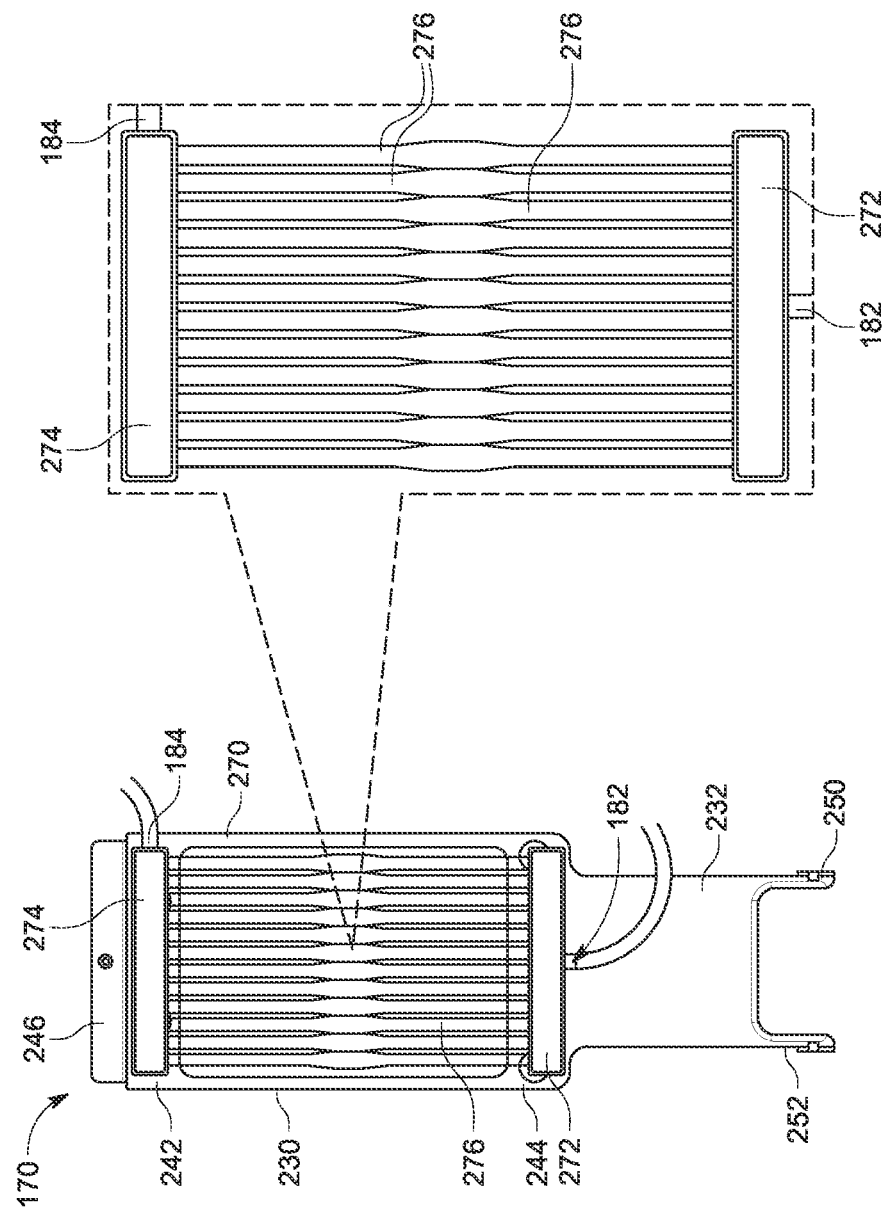
FIG. 2C is a top view of the cold plate bracket of the example cooling assembly in FIG. 1A, according to certain aspects of the present disclosure.

FIG. 2C is a top view of the cold plate bracket 170. As shown in FIGS. 2A-2C, the cold plate bracket 170 includes a support member 230 extending from a rectangular frame 232. The frame 232 includes side walls 234 and 236, a front wall 238 and a rear wall 240. The walls 234, 236, 238, and 240 have dimensions that allow the frame 232 to encompass the array of sockets 130 and corresponding inserted DIMMs 134 in FIGS. 1A-1B. A mounting flange 242 extends into the frame 232 from the front wall 238 and a mounting flange 244 extends into the frame 232 from the rear wall 240. A support tab 246 extends from the exterior of the front wall 238. The support tab 246 may have a hole that allows the tab 246 be attached to the cross member 126 on the chassis 110 via a releasable screw 248 to lock the cooling assembly 150 on the DIMMs 134.

The support member 230 includes a pair of extended arms 250 and 252 that are positioned parallel to each other. The ends of the arms 250 and 252 have pins that are rotatably attached to holes in the tabs 216 and 218 of the support base 160 to allow the cold plate bracket 170 to be rotated. The cold plate bracket 170 may thus be rotated into a closed position over the DIMMs 134 as shown in FIG. 1A. As will be explained the cold plate bracket 170 supports a micro-pipe assembly 270 that include the micro-pipes that may be inserted between individual DIMMs 134 to allow circulation of coolant when the cold plate bracket 170 is rotated into the closed position. The cold plate bracket 170 may also be rotated away from the DIMMs 134 to an open position as shown in FIG. 1B that allows the removal or insertion of DIMMs into the sockets of the array of sockets 130.

Figure 2D:
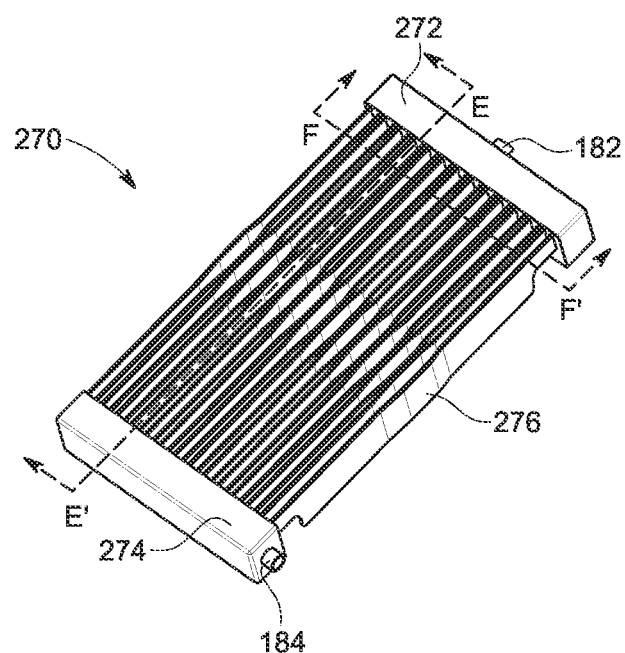
FIG. 2D is a perspective view of the micro-pipe assembly of the cold plate bracket, according to certain aspects of the present disclosure.
Figure 2E:
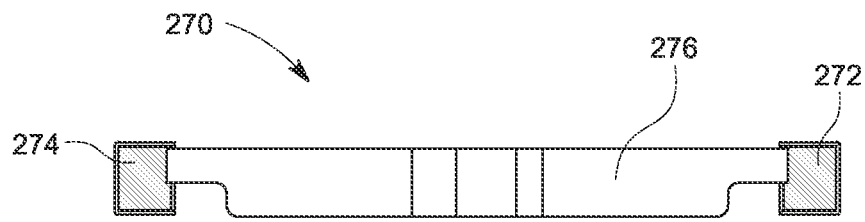
FIG. 2E is a side view of the micro-pipe assembly of the cold plate bracket, according to certain aspects of the present disclosure.
Figure 2F:
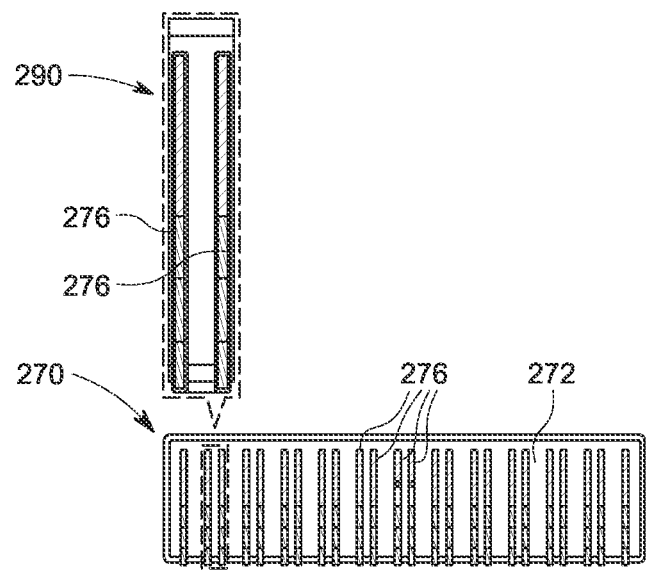
FIG. 2F is a lateral cross-section view of the micro-pipe assembly of the cold plate bracket, according to certain aspects of the present disclosure.

FIG. 2D is a perspective view of the micro-pipe assembly 270. FIG. 2E is a side view of the micro-pipe assembly 270 along the line E-E' in FIG. 2D. FIG. 2F is a lateral cross-section view of the micro-pipe assembly 270 along the line F-F' in FIG. 2D showing the cross-section of some of the micro-pipes 276. As may be seen in FIGS. 2D-2F, the micro-pipe assembly 270 is rectangularly shaped and is attached to the mounting flanges 242 and 244 of the frame 232. The micro-pipe assembly 270 is contained between the walls 234, 236, 238, and 240 of the frame 232.

The micro-pipe assembly 270 includes a cold manifold 272 and a hot manifold 274. The cold manifold 272 is proximate the rear wall 240 of the frame 232 and is attached to the mounting flange 244. The cold manifold 272 receives coolant from the inlet hose 182. The hot manifold 274 is proximate the front wall 238 of the frame 232 and is attached to the mounting flange 242. A series of micro-pipes 276 are fluidly coupled between the cold manifold 272 and the hot manifold 274. In this example, the micro-pipes 276 are fabricated from heat absorbent material such as copper or aluminum. As shown by an inset 290 in FIG. 2F, the micro-pipes 276 in this example each have a rectangular cross-section having sides of a height approximately the height of a DIMM. The micro-pipes 276 in this example, each have an interior width such as 0.6 mm with a wall thickness such as 0.2 mm that allow their insertion between the DIMMs 134.

The cold plate bracket 170 positions the micro-pipe assembly 270 relative to the DIMMs 134. In this manner, two micro-pipes 276 are positioned in proximity to thermally contact respective opposite sides of each of the DIMMs 134. The micro-pipes 276 allow coolant to flow from the cold manifold 272 and absorb heat generated from the DIMMs 134 over the relatively large side surfaces of the micro-pipes 276 that are in thermal contact with the DIMMs 134. Heated coolant is collected in the hot manifold 274 from the micro-pipes 276 and flows out through the outlet hose 184.

Figure 3A:
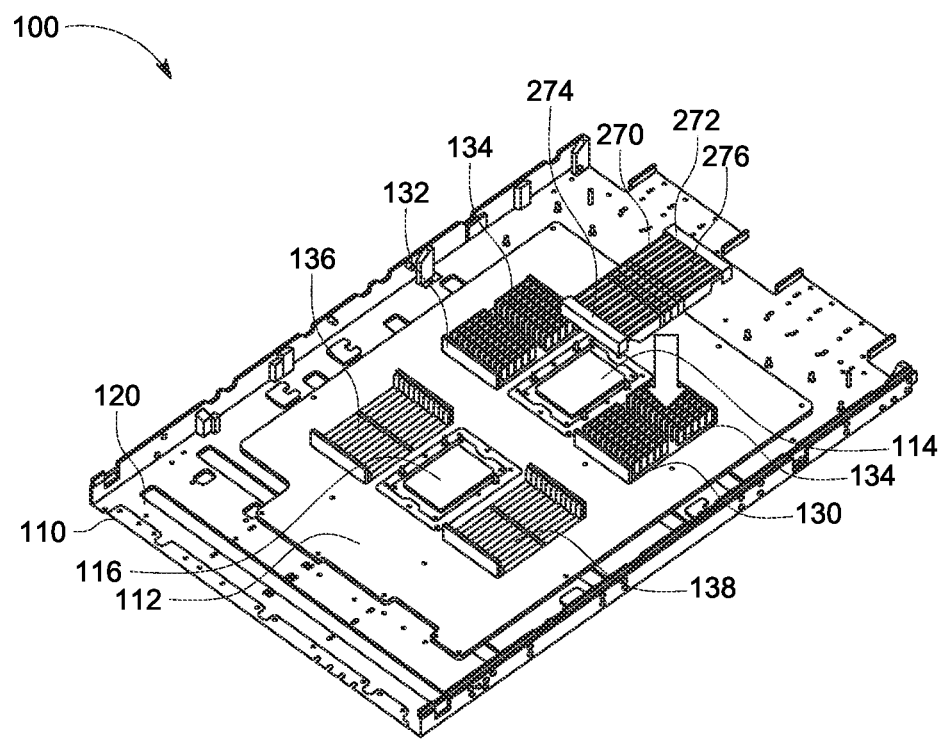
FIG. 3A is a perspective exploded view of the micro-pipe assembly in relation to the chassis in the computer device in FIG. 1A, according to certain aspects of the present disclosure.
Figure 3B:
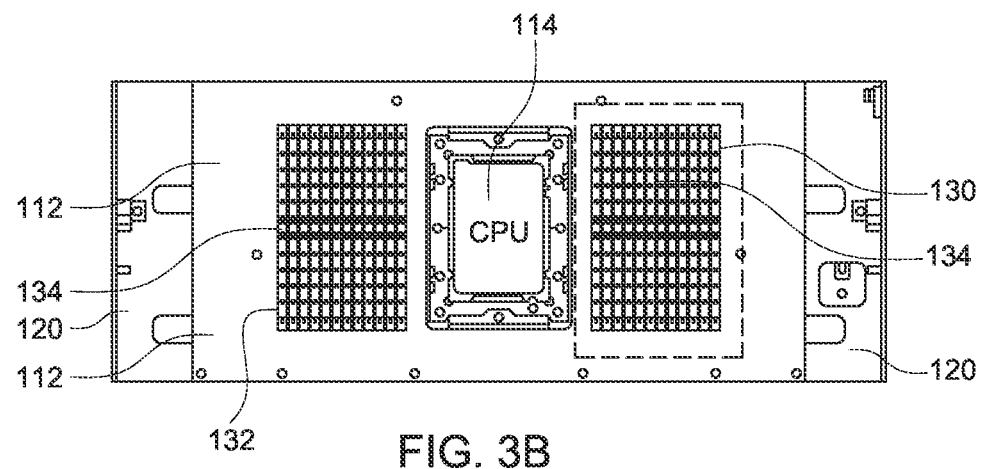
FIG. 3B is a top view of the chassis before installation of the micro-pipe assembly, according to certain aspects of the present disclosure.
Figure 3C:
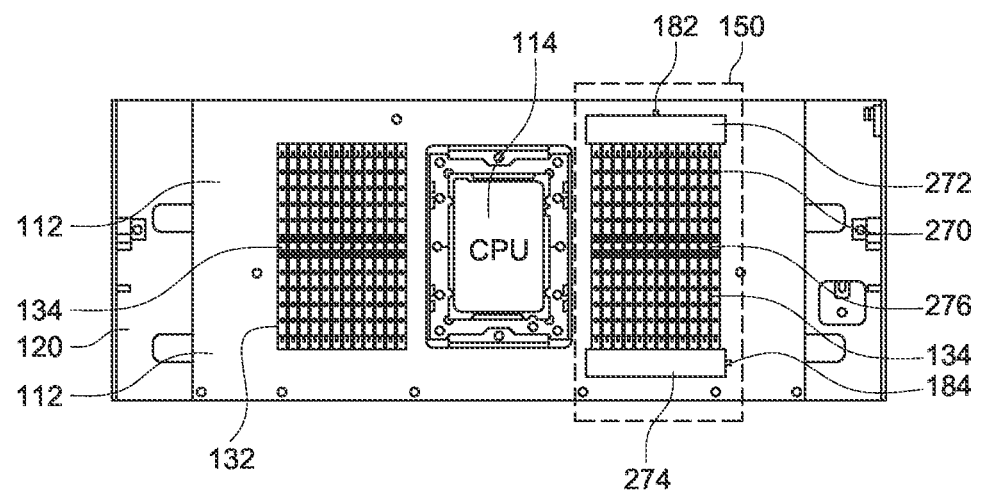
FIG. 3C is a top view of the chassis of the computer device with the micro-pipe assembly installed on a set of arrayed devices, according to certain aspects of the present disclosure.

The cooling assembly 150 allows a relatively compact arrangement for liquid cooling of the DIMMs 134 in each of the arrays of sockets 130, 132, 136 and 138. FIG. 3A is a perspective exploded view of the cooling assembly 150 in relation to the chassis 110. FIG. 3B is a top view of the chassis 110 before installation of the cooling assembly 150. FIG. 3C is a top view of the chassis of the chassis 110 with the micro-pipe assembly 270 inserted over the DIMMs 134 in the array of sockets 130.

Figure 4:
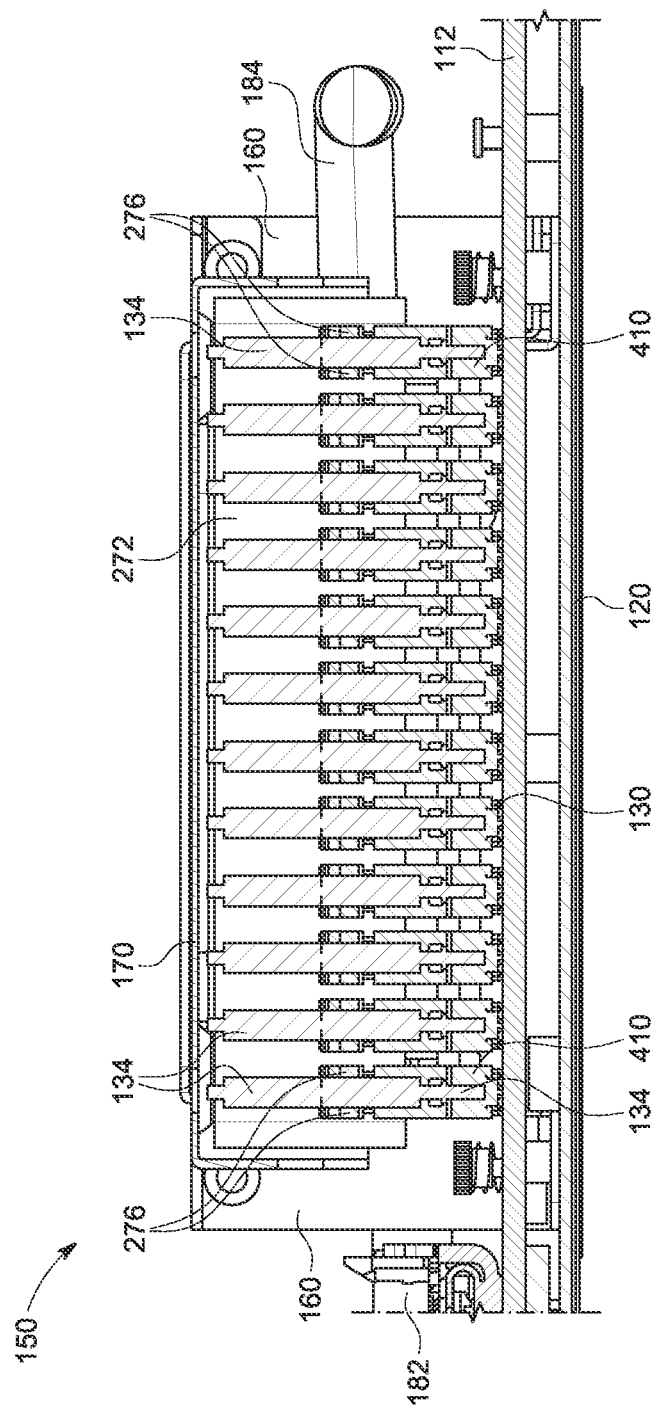
FIG. 4 is a cutaway view of the example cooling system in FIG. 1A installed on an array of memory modules in an array of sockets, according to certain aspects of the present disclosure.

FIG. 4 is a cutaway side view of the example cooling assembly 150 installed on DIMMs 134 inserted in the sockets of the array of sockets 130. The array of sockets 130 are attached to the motherboard 112 in proximity to a processor socket. The array of sockets 130 includes individual DIMM sockets 410 that each allow insertion of an individual DIMM 134. When the bracket 170 is rotated to the closed position, two micro-pipes 276 are positioned on each side of the DIMMs 134. In this example, the micro-pipes 276 are proximate most of the height of the DIMMs 134 to allow maximum thermal conduction to the micro-pipes 276. The width of each of the micro-pipes 276 is narrow enough to allow the micro-pipes 276 to be inserted in the gaps between each of the DIMMs 134.

Figure 5A:
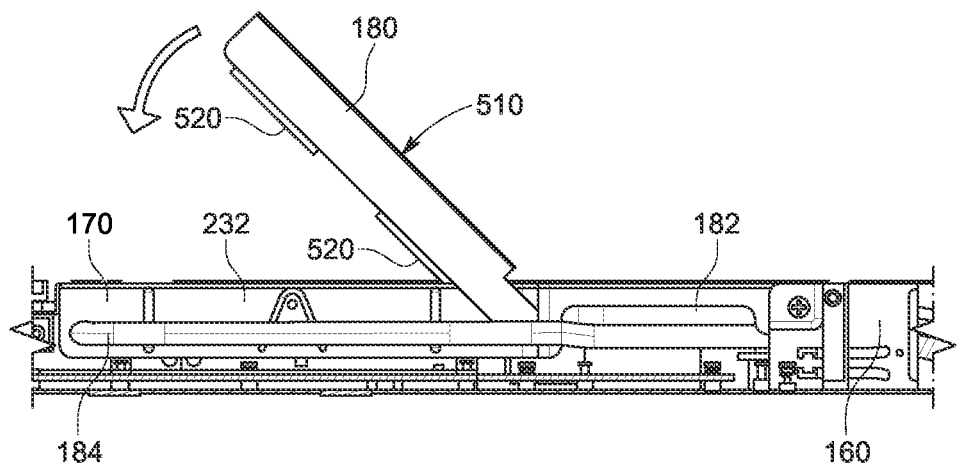
FIG. 5A is a side view of the example cooling assembly with the first type of cover in an open position, according to certain aspects of the present disclosure.

As explained above, the cover 180 is inserted over the frame 232 of the bracket 170. FIG. 5A is a side view of the example cooling assembly 150 with a first type of cover 180. FIG. 5B is a cross-section view of the example cooling assembly 150 with the cover 180 inserted over the frame 232. The cover 180 has a rectangular top panel 510 that is attached to side walls that may be inserted over the frame 232. The interior of the top panel 510 has parallel fins 520 that are spaced so they may be inserted between the micro-pipes 276 in the gaps between the DIMMs 134. In this manner, as shown in an inset 530, when the cover 180 is installed over the frame 232, the fins 520 force the micro-pipes 276 into contact with the sides of the DIMMs 134 to maximize contact and therefore thermal conductivity. In this example, the cover 180 is rotatably coupled to the frame 232 of the bracket 170. The cover 180 may be rotated away from the frame 232 to allow access to the DIMMs 134. The cover 180 may be rotated into place to cover the frame 232 thus insert the fins 520 between the DIMMs 134 in the frame 232.

Figure 6A:
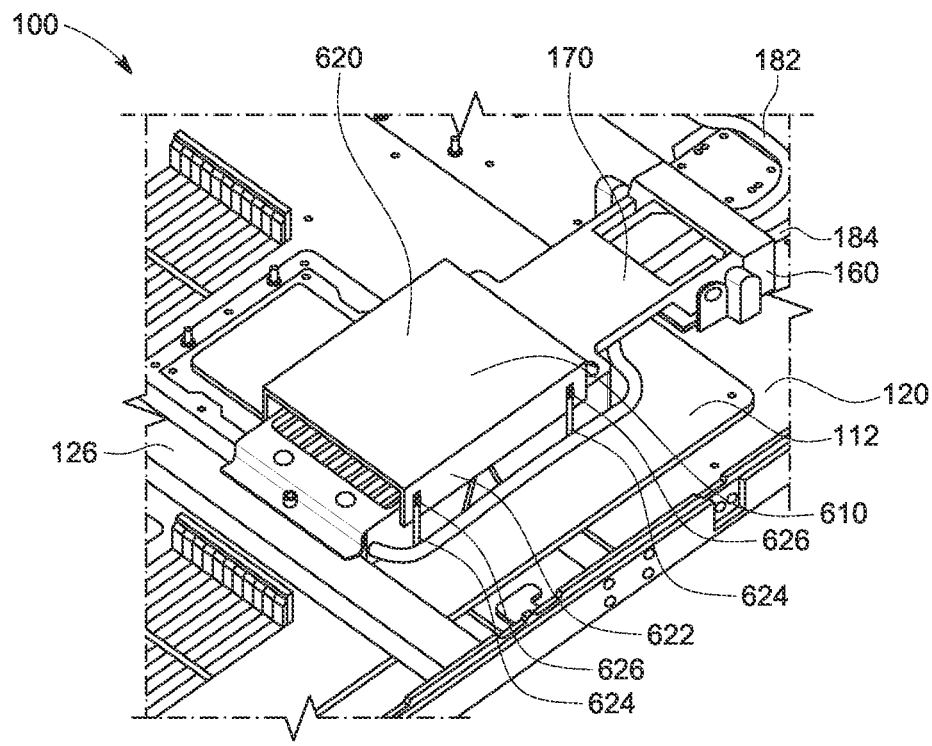
FIG. 6A is a close up perspective view of the example cooling assembly with a second type of cover, according to certain aspects of the present disclosure.
Figure 6B:
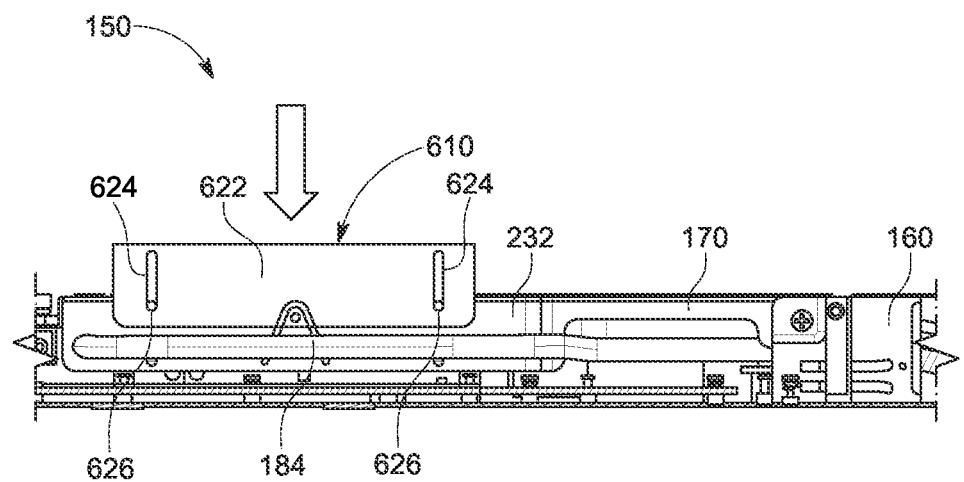
FIG. 6B is a side view of the example cooling assembly with the second type of cover. according to certain aspects of the present disclosure.
Figure 6C:
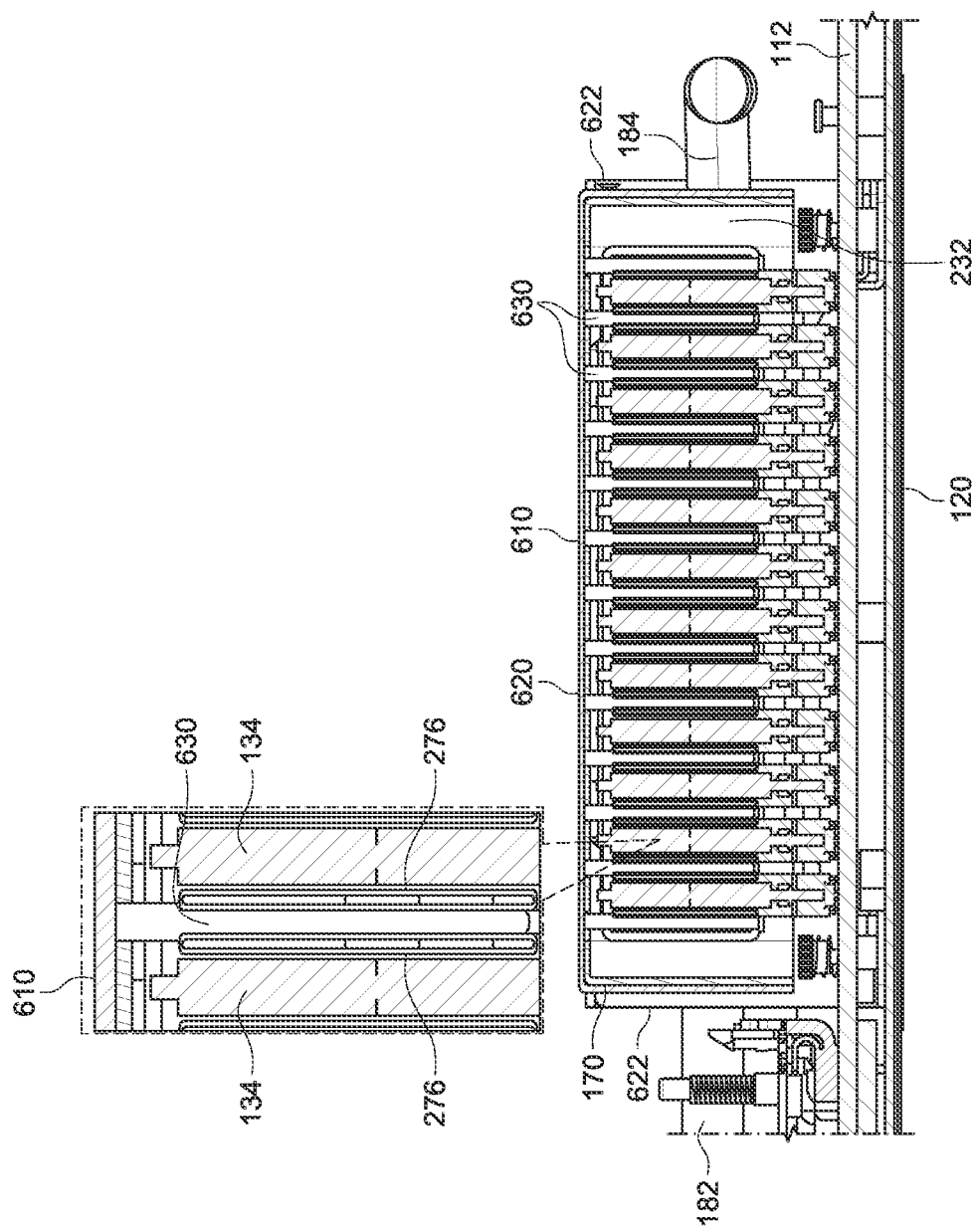
FIG. 6C is a cross section view of the example cooling assembly with the second type of cover, according to certain aspects of the present disclosure.

FIG. 6A is a close-up perspective view of the example cooling assembly 150 with a second type of cover 610. FIG. 6B is a side view of the example cooling assembly 150 with the second type of cover 610 removed from the bracket 170. FIG. 6C is a cross section view of the example cooling assembly with the second type of cover 610 inserted on the micro-pipe assembly 270. Like elements of the cooling assembly 150 in FIGS. 6A-6C are labeled with identical reference numbers as their counterparts in FIGS. 1-4.

Similar to the cover 180 in FIGS. 5A-5B, the cover 610 includes a top panel 620 with downward extending side walls 622 that cover the frame 232. The side walls 622 each include two vertical slots 624. The interior of the top panel 620 includes downward extending parallel fins 630. As shown in an inset 640, the fins 630 are spaced to be inserted between the micro-pipes 276 and DIMMs 134 to force contact between the micro-pipes 276 and the DIMMs 134. In this example, the sides of the frame 232 include registration features such as pins 626. Each of the pins 626 may be inserted into the corresponding slots 624 in the side walls 622 of the cover 610. In this manner, the cover 610 may be lowered into place on the frame 232 guided by the pins 626 in the slots 624 as shown in FIG. 6A.

Although the cooling assembly 150 is described above in relation to applying liquid cooling with arrays of DIMMs, the design of the cooling assembly 150 may be used for other types of heat-generating components that have a largely rectangular shapes that are mounted in sockets in perpendicular orientation to a circuit board. The design of the example cooling assembly 150 may be applied to such heat-generating components that are arranged in arrays of parallel sockets. These devices may include solid state drive (SSD) storage devices having E.1S, M.2, or U.2 form factors.

Figure 7A:
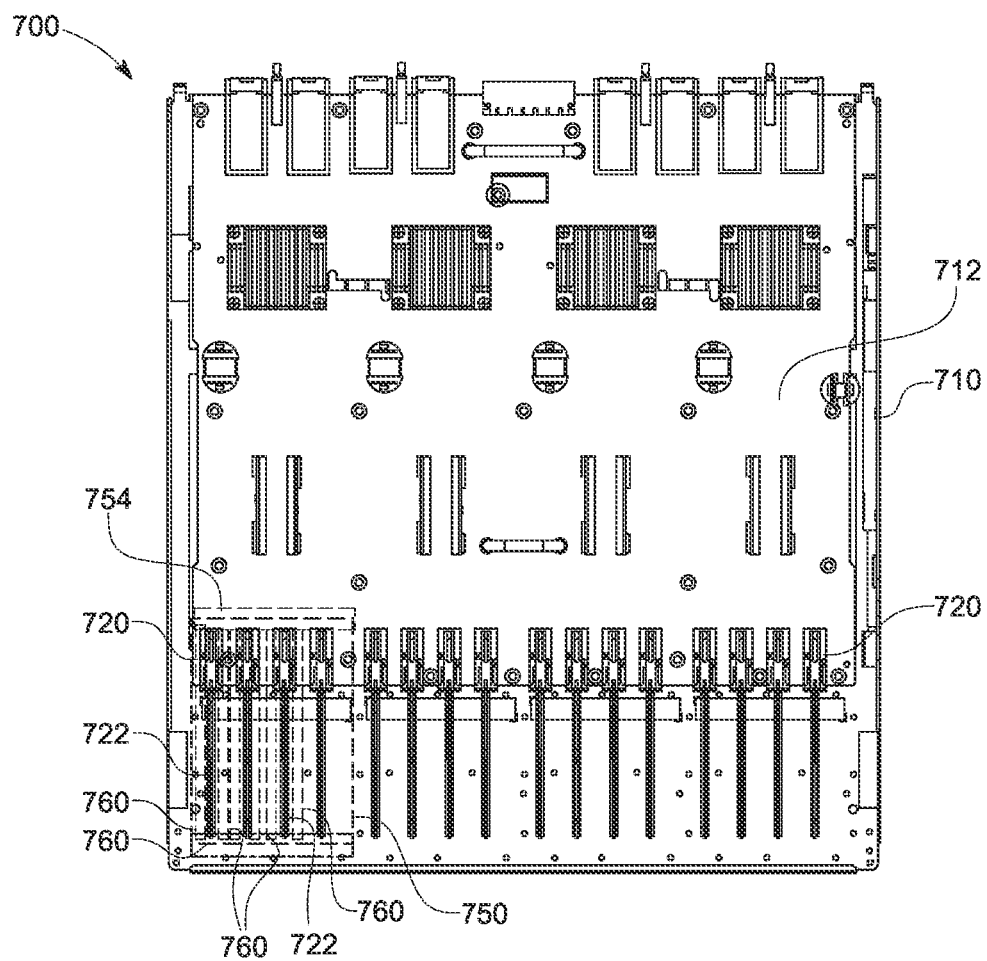
FIG. 7A is a top view of a computer device with an alternative example cooling assembly for cooling an array of another type of heat-generating device, according to certain aspects of the present disclosure.
Figure 7B:
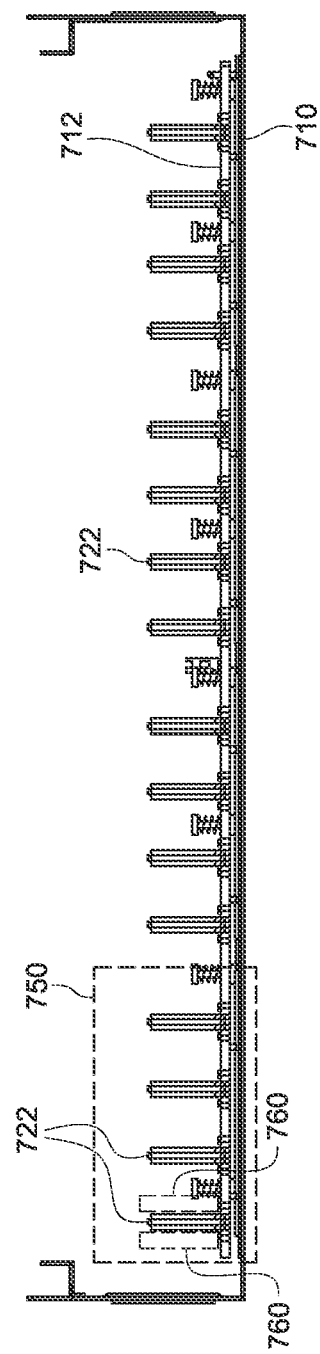
FIG. 7B is a side view of the computer device with the alternate example cooling assembly in FIG. 7A, according to certain aspects of the present disclosure.

FIG. 7A is a top view of a computer system 700 that incorporates the above-described principles for liquid cooling of another type of heat-generating component. FIG. 7B is a side view of the computer system 700. The computer system 700 includes a chassis 710 that holds circuit boards for electronic components such as a motherboard 712. Similar to the motherboard 112 in FIG. 1A-1B, the motherboard 712 includes components such as processors, memory modules, power supplies, network interfaces, and the like.

In this example, one edge of the motherboard 712 includes a series of sockets 720 that allow the insertion of heat-generating components. In this example, the heat-generating components are storage devices 722 in a rectangular E.1S form factor. The storage devices 722 are each inserted into a corresponding socket 720. The storage devices 722 provide permanent storage of data for the computer system 700.

An example liquid cooling assembly 750 may inserted over groups of the heat-generating storage devices 722. In this example, the example liquid cooling assembly 750 allows cooling of four of the storage devices 722. The liquid cooling assembly 750 includes a cold manifold 752 and a hot manifold 754. As with the cooling assembly 150 in FIGS. 1A-1B, a connector supplies coolant to the cold manifold 752. Hot coolant is collected from a connector coupled to the hot manifold 754. A series of micro-pipes 760 allow coolant flow between the cold manifold 752 and the hot manifold 754. The micro-pipes 760 have a rectangular cross section with sides that overlap a large portion of the sides of the storage devices 722. Thus, each of the storage devices 722 have a micro-pipe 760 on either side. Heat generated from the storage device 722 is thus transferred to the coolant flowing through the micro-pipes 760.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A cooling assembly for cooling a heat-generating component, the cooling assembly comprising:
a micro-pipe assembly having a cold manifold, a hot manifold and first and second micro-pipes, wherein the first and second micro-pipes are fluidly coupled between the cold manifold and hot manifold to allow coolant flow between the cold manifold and the hot manifold;
a cold plate bracket supporting the micro-pipe assembly, the cold bracket moveable from an open position to a closed position, the closed position positioning the micro-pipe plate assembly in a position relative to the heat-generating component such that the first and second micro-pipes are in proximity to respective sides of the heat-generating component;
a coolant inlet supplying coolant to the cold manifold; and
a coolant outlet collecting coolant from the hot manifold.

2. The cooling assembly of claim 1, further comprising a base member mounted on a bottom panel of a chassis, wherein the heat-generating component is mounted on a circuit board mounted on the bottom panel, and wherein the cold plate bracket is attached to the base member and extends over the circuit board.

3. The cooling assembly of claim 2, wherein the heat-generating component is a dual-in line memory module (DIMM).

4. The cooling assembly of claim 3, wherein the DIMM is one of a plurality of DIMMs inserted in parallel sockets in proximity to a processor on the circuit board.

5. The cooling assembly of claim 4, wherein the first and second micro-pipes are included in a plurality of micro-pipes that each are fluidly coupled between the cold manifold and hot manifold to allow coolant flow between the cold manifold and the hot manifold.

6. The cooling assembly of claim 2, wherein the heat-generating component is a device conforming to at least one of E.1S, U.2, or M.2 standards.

7. The cooling assembly of claim 2, wherein the cold plate bracket is rotatably attached to the base member, the cold plate bracket being rotatable between the closed position and the, the heat-generating component being accessible in the open position, the heat-generating component being inaccessible in the closed position.

8. The cooling assembly of claim 1, further comprising a cover coupled to the cold plate bracket, the cover including a vertical fin inserted parallel to the heat-generating component to force the first micro-pipe into contact with the heat-generating component.

9. The cooling assembly of claim 8, wherein the cover is rotatably attached to the cold plate bracket.

10. The cooling assembly of claim 8, wherein the cover slides in position over the cold plate bracket via registration features.

11. A computer device comprising:
a circuit board;
a heat-generating computer component mounted on the circuit board;
a micro-pipe assembly having a cold manifold, a hot manifold, and first and second micro-pipes, wherein the first and second micro-pipes are fluidly coupled between the cold manifold and hot manifold to allow coolant flow between the cold manifold and the hot manifold;
a cold plate bracket supporting the micro-pipe assembly, the cold bracket moveable from an open position to a closed position, the closed position positioning the micro-pipe assembly relative to the heat-generating component such that the first and second micro-pipes are in proximity to respective sides of the heat-generating component;
a coolant inlet supplying coolant to the cold manifold; and
a coolant outlet collecting coolant from the hot manifold.

12. The computer device of claim 11, further comprising a base member mounted on a bottom panel of a chassis, and wherein the cold plate bracket is attached to the base member and extends over the circuit board.

13. The computer device of claim 12, wherein the heat-generating component is a dual-in line memory module (DIMM).

14. The computer device of claim 12, wherein the heat-generating component is a device conforming to at least one of E.1S, U.2, or M.2 standards.

15. The computer device of claim 12, wherein the DIMM is one of a plurality of DIMMs inserted in parallel sockets in proximity to a processor.

16. The computer device of claim 15, wherein the first and second micro-pipes are included in a plurality of micro-pipes that each are fluidly coupled between the cold manifold and hot manifold to allow coolant flow between the cold manifold and the hot manifold.

17. The computer device of claim 12, wherein the cold plate bracket is rotatable between the open position and a closed position, the heat-generating component being accessible in the open position, the heat-generating component being inaccessible in the closed position.

18. The computer device of claim 12, further comprising a cover coupled to the bracket, the cold plate cover including a vertical fin inserted parallel to the heat-generating component to force the first micropipe into contact with the heat-generating component.

19. The computer device of claim 18, wherein the cover is rotatably attached to the cold plate bracket.

20. The computer device of claim 18, wherein the cover slides in position over the cold plate bracket via registration features.

* * * * *